(12) United States Patent
Lee

(10) Patent No.: US 7,667,654 B2
(45) Date of Patent: Feb. 23, 2010

(54) PORTABLE TERMINAL HAVING ANTENNA APPARATUS

(75) Inventor: Hyok Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 532 days.

(21) Appl. No.: 11/460,214

(22) Filed: Jul. 26, 2006

(65) Prior Publication Data

US 2007/0024508 A1 Feb. 1, 2007

(30) Foreign Application Priority Data

Jul. 26, 2005 (KR) .................... 10-2005-0068081

(51) Int. Cl.
*H01Q 1/24* (2006.01)
*H01Q 9/16* (2006.01)

(52) U.S. Cl. .................... 343/702; 343/822; 343/860
(58) Field of Classification Search .................... None
See application file for complete search history.

(56) References Cited

U.S. PATENT DOCUMENTS 5,952,973 A * 9/1999 Uematsu et al. ....... 343/700 MS
6,118,379 A * 9/2000 Kodukula et al. ........ 340/572.8

* cited by examiner

*Primary Examiner*—Trinh V Dinh
(74) *Attorney, Agent, or Firm*—Lee, Hong, Degerman, Kang & Waimey

(57) ABSTRACT

A wireless communication device comprising a substrate, an antenna unit mounted on the substrate, and multiple conductive pads at one or more periphery regions of the substrate, one conductive pad among the multiple conductive pads being connected with and providing impedance matching to the antenna unit.

11 Claims, 5 Drawing Sheets

PORTABLE TERMINAL HAVING ANTENNA APPARATUS

CROSS-REFERENCE TO RELATED APPLICATIONS

Pursuant to 35 U.S.C. § 119(a), this application claims the benefit of earlier filing date and right of priority to Korean Application No. 10-2005-0068081, filed on Jul. 26, 2005, the contents of which is hereby incorporated by reference herein in its entirety.

BACKGROUND

1. Field of the Invention

The present invention relates to an antenna apparatus and a portable terminal having the same, and more particularly, to an antenna apparatus capable of having an enhanced antenna function with minimal installation space, and a portable terminal having the same.

2. Description of the Background Art

A Bluetooth apparatus allows short-range wireless communication between electronic devices (e.g., a computer, a portable terminal, home appliances, etc.), and is generally installed in a portable terminal (e.g., mobile phone, PDA, etc.).

FIG. 1 is a perspective view showing a portable terminal having a Bluetooth apparatus in accordance with the related art, and FIG. 2 is a frontal view showing a printed circuit board having a Bluetooth apparatus in accordance with the related art.

The related art portable terminal comprises a terminal body 110 having a key pad 102 for inputting information at a front surface and having a printed circuit board 104 on which circuit components are mounted therein, and a display unit 124 rotatably connected to the terminal body 110 by a hinge 120 and having a display 122 for displaying information.

A Bluetooth apparatus is installed at the printed circuit board 104. Also, a non-ground region 130 with a ground removed for mounting the Bluetooth apparatus is formed at the printed circuit board 104.

The Bluetooth apparatus includes a Bluetooth antenna 132 installed at the non-ground region 130 of the printed circuit board 104; a matching stub 134 electrically connected to one end of the Bluetooth antenna 132 and installed at the non-ground region 130 of the printed circuit board 104, for matching the Bluetooth antenna 132; and a Bluetooth chip set 136 for processing an electric signal from the Bluetooth apparatus.

In the related art portable terminal, sufficient space (i.e., an appropriate sized footprint) for the non-ground region 130 having a relatively large size that is needed for installing the Bluetooth antenna 132 and the matching stub 134 has to be obtained. However, this reduces the amount of available space for the Bluetooth apparatus and other elements on the printed circuit board 104 and thus a spatial utilization degree of the printed circuit board 104 is not optimal.

Furthermore, in the related art portable terminal, since the amount of non-ground region 130 is relatively large, the amount of ground region is relatively small, which thereby decreases the function of the portable terminal.

Additionally, in the related art portable terminal, the Bluetooth antenna 132 and the matching stub 134 are arranged relatively near a center portion of the printed circuit board 104. As a result, the Bluetooth antenna 132 and the matching stub 134 are easily influenced by external interference (e.g., caused by the user's fingers or head during use, etc.). This degrades the formation of a desired signal emission pattern, thereby degrading the function of the Bluetooth antenna.

SUMMARY

One aspect of the present invention involves the recognition by the present inventor about the problems of the related art described above. Based upon this recognition, the features of the present invention have been developed.

The present invention provides an antenna apparatus capable of enhancing a spatial utilization degree and a design freedom degree of a printed circuit board by decreasing a non-ground region of the printed circuit board for mounting the antenna apparatus and capable of preventing a function lowering of a portable terminal, and a portable terminal having the same.

Also, the present invention provides an antenna apparatus capable of is having an enhanced function by being installed at an edge of a printed circuit board and thus by being less influenced by an external interference, and a portable terminal having the same.

More specifically, the present invention provides a portable terminal, that may comprise: a terminal body having a printed circuit board therein; and a antenna apparatus including a matching stub mounted at the printed circuit board, and a antenna electrically connected to the matching stub, wherein hole ground pads are formed at a periphery of a screw hole formed at the printed circuit board, and one of the hole ground pads is used as the matching stub.

A non-ground region with a ground removed for mounting the antenna apparatus may be formed at an edge of the printed circuit board. The matching stub may be formed at a periphery region of the screw hole as a semicircular belt shape. The matching stub may be implemented by electrically connecting one of the hole ground pads to the antenna as a non-ground state. The hole ground pads may consist of a first pad used as the matching stub with a non-grounded state, and a second pad separated from the first pad and used as the hole ground pad by being grounded.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the Drawings.

DETAILED DESCRIPTION

Those skilled in the art can clearly understand that the features of the present invention may be applied to various types of wireless communication devices (such as a mobile phone, handset, PDA, and the like, which will simply be referred to as a portable terminal). Hereinafter, a folder type portable terminal according to the present invention will be explained in more detail. The present invention is applicable to other portable terminal configurations (bar type, slider type, swivel type, etc.) as well.

Figure 3:
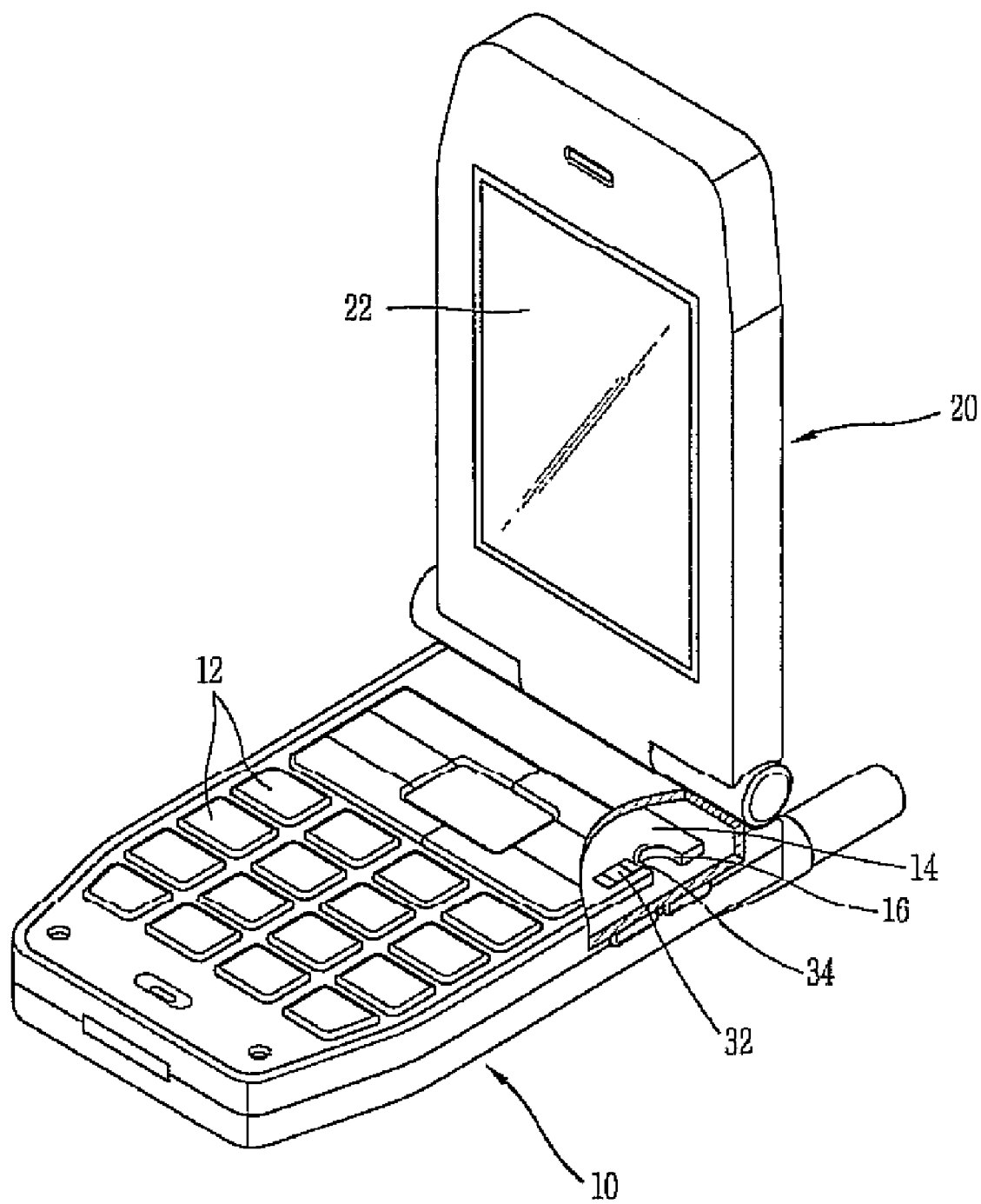
FIG. 3 is a perspective view showing an exemplary portable terminal having a antenna apparatus according to the present invention.
Figure 4:
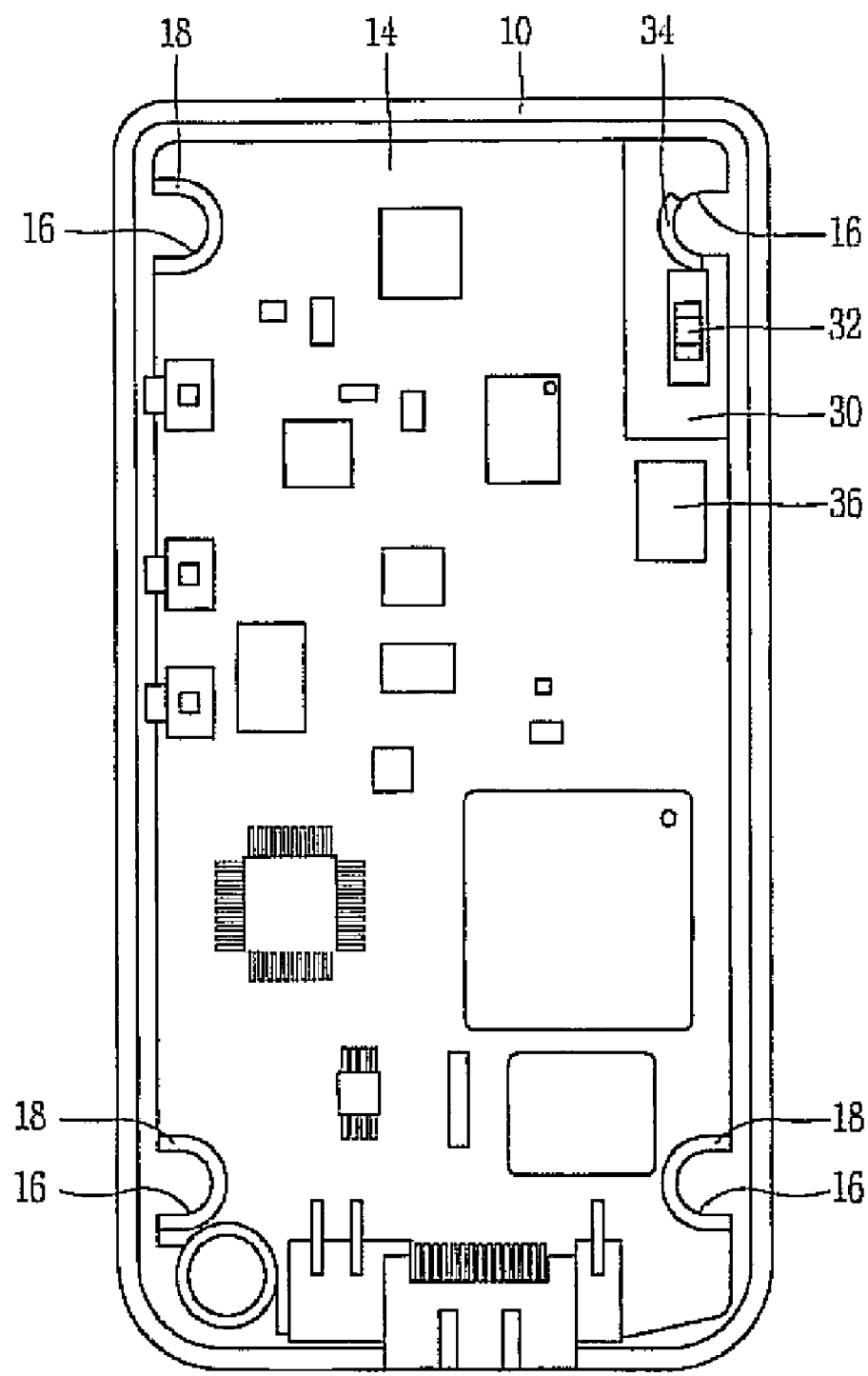
FIG. 4 is a frontal view showing an exemplary printed circuit board having a antenna apparatus according to a first embodiment of the present invention.

FIG. 3 is a perspective view showing a portable terminal having an antenna apparatus according to the present invention, and FIG. 4 is a frontal view showing a printed circuit board having a antenna apparatus according to a first embodiment of the present invention.

The portable terminal according to the present invention may comprise a terminal body 10 (housing, frame, etc.) having a key pad 12 (and/or other types of user input devices such as a touch-sensitive screen, click wheel, function buttons, etc.) for inputting information at a front surface and having a printed circuit board (PCB) 14 (or other type of substrate) on which circuit components are mounted; a display unit 20 (including a graphics processor, image processing circuitry, etc.) having a display 22 (screen, LCD, OLED, etc.) mounted on the terminal body 10 for displaying information; and an antenna apparatus mounted at the printed circuit board 14.

A screw notch 16 (e.g., a screw-coupling hole or other attachment opening, indentation, etc.) that allows screw-coupling the printed circuit board 14 to the terminal body 10 is respectively formed at four edges of the printed circuit board 14. It can be understood that such attachment openings may be formed at other alternative and/or additional locations of the substrate (PCB 14) to allow adequate attachment with the terminal body 10.

Also, a hole ground pad 18 (or other grounding element, ground terminal, etc.) for connecting a ground of the printed circuit board 14 to a ground layer deposited (located) at an inner surface of a case of the terminal body 10 is formed at a periphery of at least one screw notch 16.

A non-ground region 30 (or other specified area on the PCB 14 not used for grounding) where the antenna apparatus is mounted, is formed at one of the four corner edges of the printed circuit board 14. Here, it can be understood that the non-grounding region 30 may be formed at other alternative locations on the PCB 14, as long as it is adjacent to an attachment opening (screw notch 16) and being relatively far from a central location of the PCB 14 (e.g., at a corner portion thereof).

Here, the antenna apparatus may be a Bluetooth™ (BT) antenna apparatus that allows short-range wireless communication. Other types of antennas, such as a chip antenna, a strip line antenna, a patch antenna, etc. may be alternatively or additionally used.

The antenna apparatus may include an antenna 32 (e.g., BT antenna, strip line antenna, etc.) installed at the non-ground region 30 and used in sending and receiving communication signals; a matching stub 34 (or other type of impedance matching element) is electrically connected to the antenna 32 for matching an impedance of the antenna 32; and a chip set 36 (e.g., a BT chip set and/or other processors, circuitry, etc.) is installed at the printed circuit board 14 for processing electric signals sent and received via the antenna 32.

One of the hole ground pads 18 formed adjacent to a corresponding screw notch 16 is electrically connected to the antenna 32 thus to be used as the matching stub 34. That is, the matching stub 34 may be implemented by electrically connecting one of the hole ground pads 18 to the antenna 32 as a non-ground state.

The exemplary embodiments of the present invention (as shown in the Figures) have four hole ground pads 18, one at each of the four corners of the PCB 14. It has been found that using one of these hole ground pads to function as a matching stub 34 for the antenna 32 does not detrimentally effect the overall grounding needed for the portable terminal. Namely, the remaining hole ground pads 18 (e.g., three shown in the Figures) provide adequate grounding for the portable terminal. Alternatively, a fourth hole ground pad 42 (as in the second embodiment shown in FIG. 5) that is separated from the matching stub 40 may be provided.

The matching stub 34 may be formed at a periphery region of the screw notch 16 formed at the printed circuit board 14 as a semicircular ridge shape (i.e., curved shoulder, bent protrusion, etc.), and is electrically connected to the antenna 32. Other appropriate shapes and configurations for the matching stub 34 are possible.

Accordingly, as one of the hole ground pads 18 is used as the matching stub 34, an additional space for installing the matching stub is not required at the printed circuit board 14, which thereby minimizes the size of the non-ground region 30 formed at the printed circuit board 14.

Figure 5:
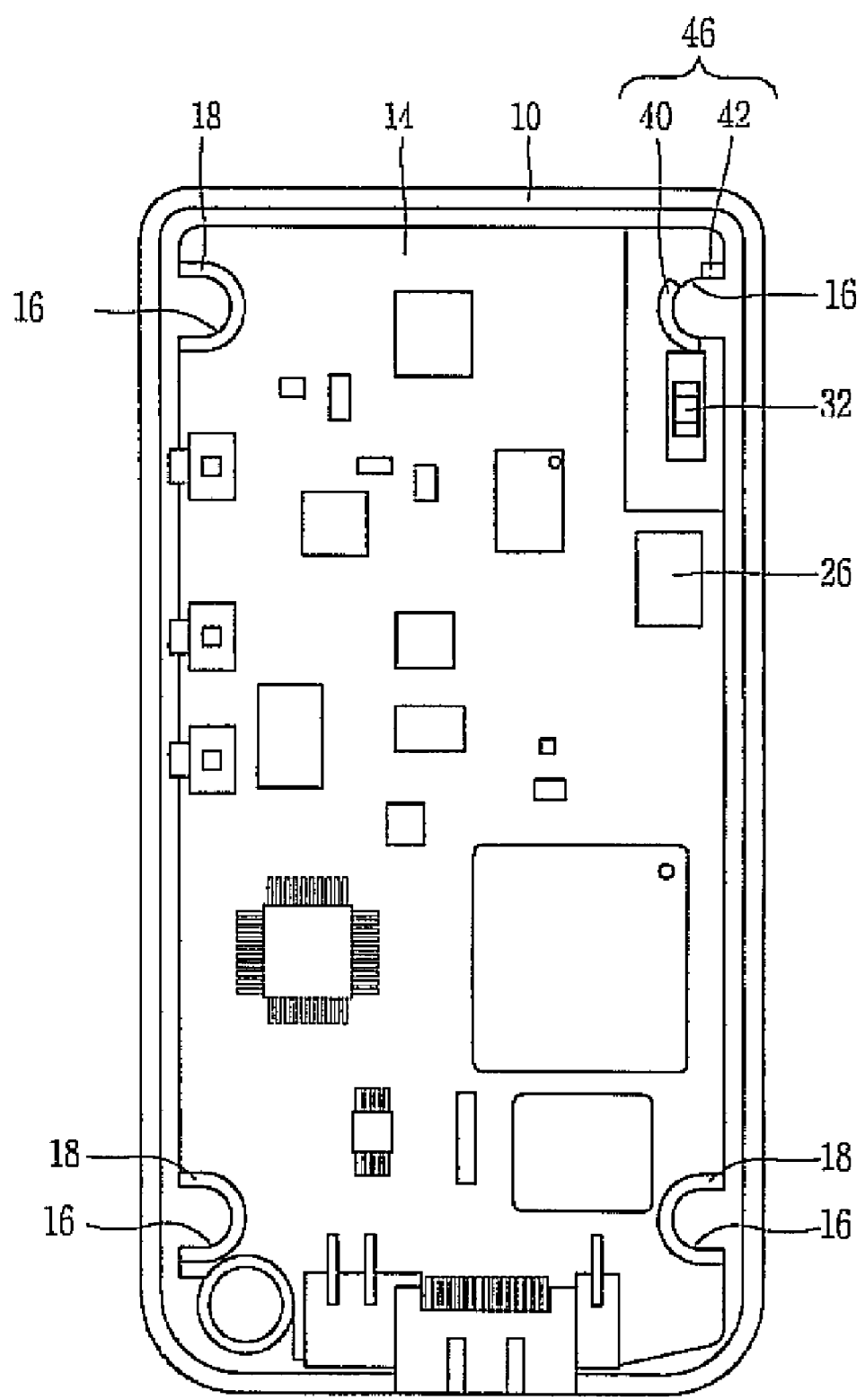
FIG. 5 is a frontal view showing an exemplary printed circuit board having a antenna apparatus according to a second embodiment of the present invention.

FIG. 5 is a frontal view showing a printed circuit board having a antenna apparatus according to a second embodiment of the present invention.

In the antenna apparatus according to another embodiment of the present invention, the non-ground region 30 with a ground removed is formed at the (corner) edge of the printed circuit board 14, and the antenna 32 is mounted at the non-ground region 30. One of the hole ground pads 18 has a section used as the matching stub 40 electrically connected to the antenna 32, and another section used as a ground pad 42 for a ground connection.

That is, the hole ground pad 18 formed at the non-ground region 30 according to the second embodiment may be divided into two parts. One of the two parts is not grounded ant electrically connected to the antenna 32 thereby to be used as the matching stub 40, and the other part is grounded thus to be used as the ground pad 42 for a ground connection.

In the antenna apparatus according to the second embodiment, a portion of the hole ground pads is used as the matching stub 40, and another portion thereof serves to perform a ground connection.

Figure 1:
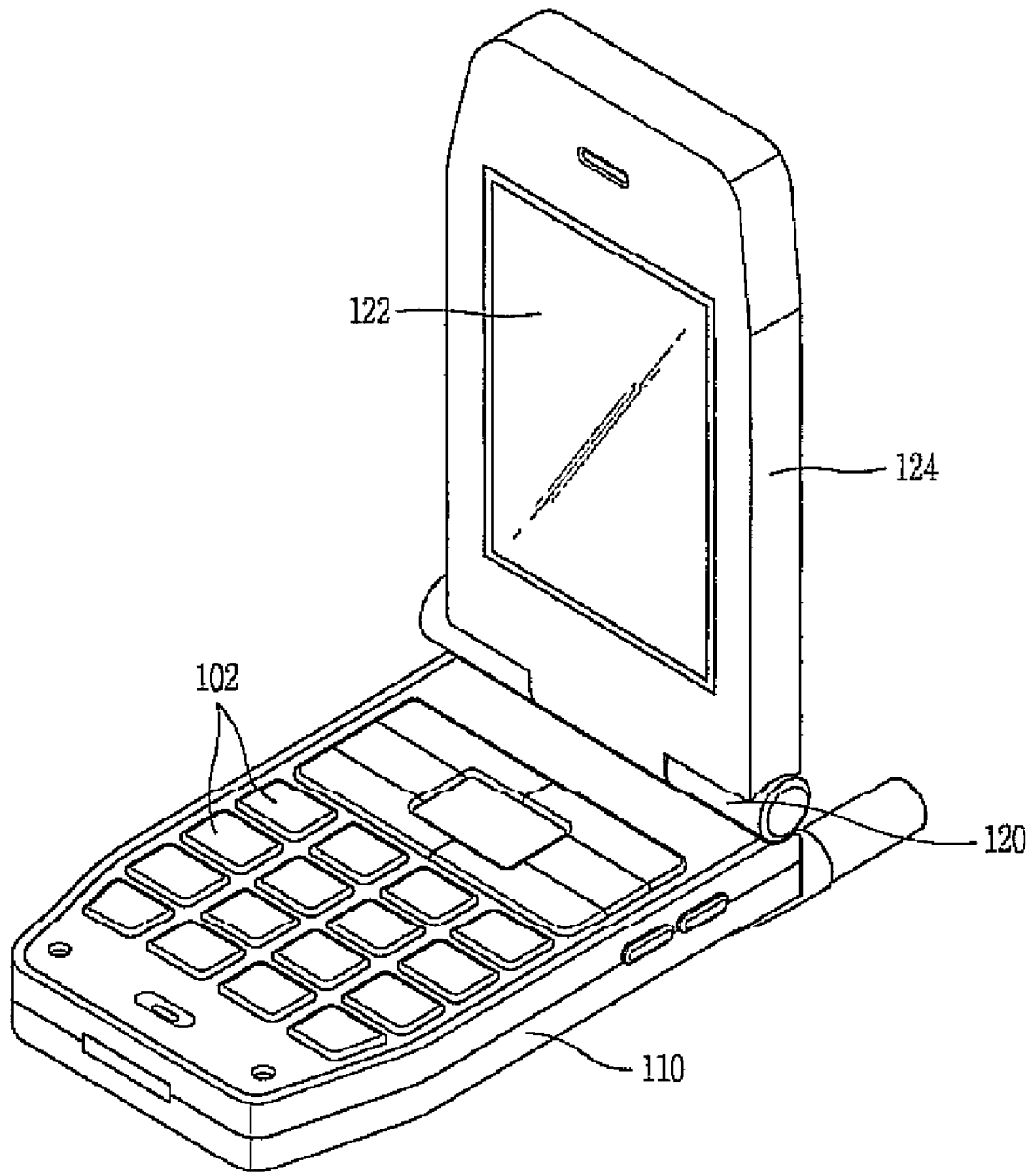
FIG. 1 is a perspective view showing a portable terminal in accordance with the related art.
Figure 2:
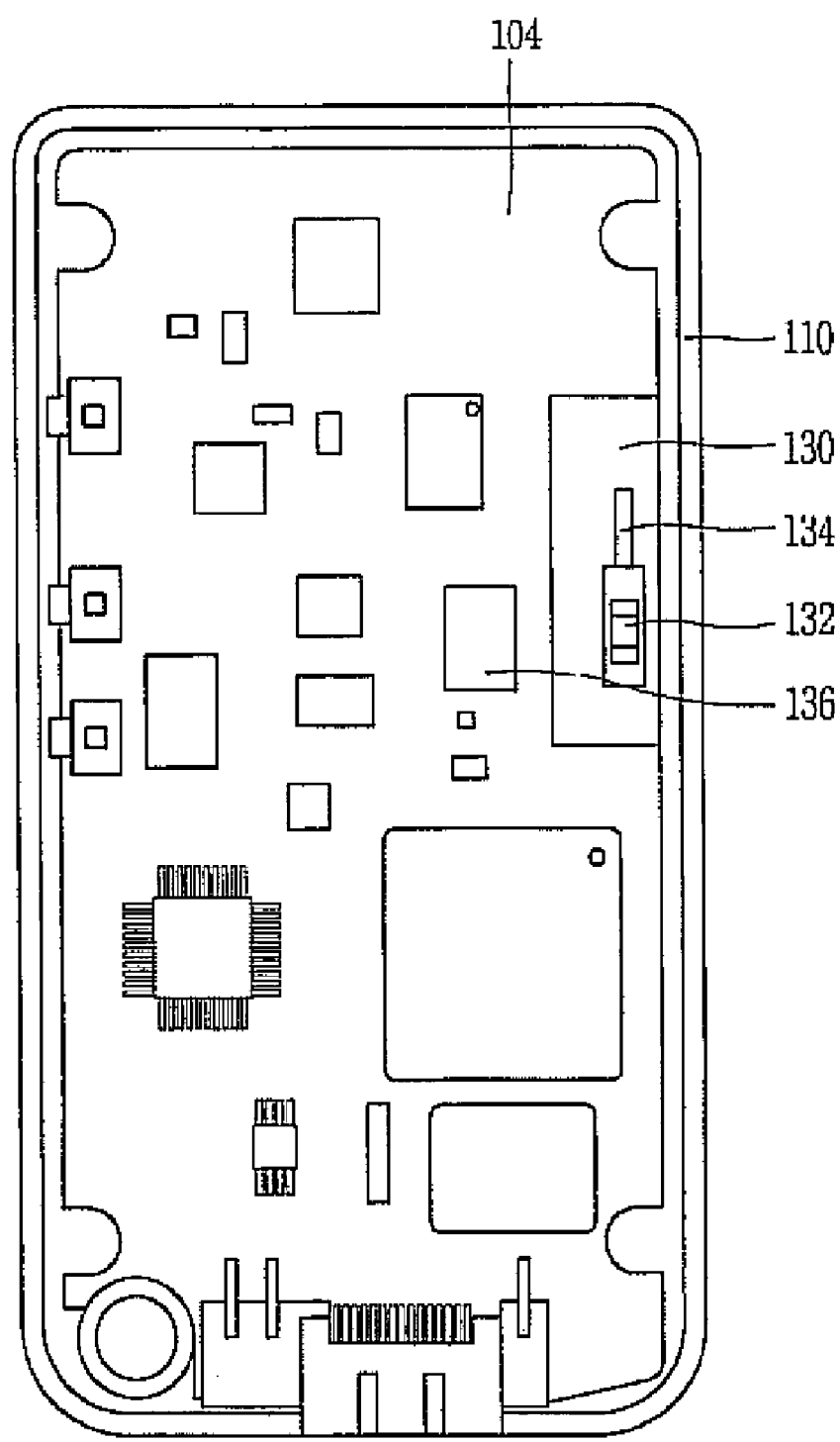
FIG. 2 is a frontal view showing a printed circuit board having a antenna apparatus in accordance with the conventional art.

The related art matching stub 134 (as shown in FIG. 2) is a separate and distinct element from all the ground pads, has a linear (straight) configuration, and is connected to the BT antenna 132 on the non-ground region 130 (of the PCB 104) located at a central region of the PCB.

In contrast, the present inventor recognized that the non-grounding region 30 may be located with the antenna apparatus (like BT antenna 32) at a corner region of the PCB 14, which thus minimizes undesirable signal interference. Also, the present inventor recognized that a hole ground pad 18 (around a screw notch 16) may be modified such that it alternatively and/or additionally functions as a matching stub (i.e., element 34 shown in FIG. 4) for the antenna 32.

Here, it can be noted that the curved length of the present invention matching stub 34 is smaller than that of the other hole ground pads 18, but is sufficient for proper functioning as a matching stub. Also, a relatively small hole ground pad 42 may be formed adjacent to but disconnected from the matching stub 40, to thus form a modified hole ground pad 46 (in FIG. 5).

Although FIGS. 4 and 5 show the non-ground region 30 located in the lengthwise direction of the portable terminal body, other configurations are possible. For example, the non-ground region 30 may be located in a widthwise direction, located at a corner of the PCB 14 along both the lengthwise and widthwise directions, or other configurations. Namely, the particular non-ground region 30 would depend upon the footprint or shape of the antenna 32 that is employed.

Such novel location and structure of the non-grounding region and matching stub according to the present invention allows more efficient use of the limited amount space on the PCB 14, thus allowing improvements in placement of various electronic components, circuits, etc. within a portable (mobile) terminal. Accordingly, an improved layout on the PCB 14 may be achieved to provide a more compact overall configuration for the portable (mobile) terminal with minimal signal interference when using a short-range communication antenna (such as the BT antenna 32).

As can be understood by referring to the Figures and the above disclosure, the present invention provides a wireless communication device comprising a substrate, an antenna unit mounted on the substrate, and multiple conductive pads at one or more periphery regions of the substrate, one conductive pad among the multiple conductive pads being connected with and providing impedance matching to the antenna unit.

The device may further comprise a non-grounded region formed at a particular corner of the substrate, with the antenna unit mounted at the non-grounded region, and the one conductive pad formed adjacent to an attachment region formed at the particular corner. The non-grounded region may be formed at the particular corner along an edge in a lengthwise and/or widthwise direction of the substrate. The attachment region may be a notch or opening that allows the substrate to be fixed to a housing via an appropriate attaching element. The conductive pad connected with the antenna unit may be non-linear to conform with a shape of the notch or opening. The curved conductive pad connected with the antenna unit may have a particular length and curvature that allows a desired impedance matching to be provided. The conductive pad connected with the antenna may comprise a single element that acts as a matching stub for the antenna unit. The conductive pad connected with the antenna may comprise a first element that acts as a matching stub for the antenna unit, and a second element disconnected from the first element and acts as a ground pad. The antenna unit may comprise a Bluetooth antenna or other type of antenna element that allows short-range wireless communications. The substrate may be a printed circuit board.

In the portable terminal according to the present invention, one of the hole ground pads 18 formed at the printed circuit board 14 is used as the matching stub 34, and thus an additional space for installing the matching stub is not necessary. As the result, a space for installing the antenna apparatus at the printed circuit board is minimized, thereby enhancing a spatial utilization degree.

Furthermore, in the portable terminal according to the present invention, since the antenna apparatus is installed at the edge of the printed circuit board, it is less influenced by an external interference such as a user's hand or head. Accordingly, the function of the antenna apparatus is enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A portable terminal, comprising:
    a terminal body;
    a printed circuit board mounted at an inner space of the terminal body, the printed circuit board having a plurality of screw holes configured to allow the printed circuit board to be screw-coupled to the terminal body;
    a plurality of hole ground pads configured to connect a ground of the printed circuit board to a ground layer of the terminal body, each of the plurality of hole ground pads being formed at a periphery of a corresponding one of the screw holes; and
    an antenna apparatus including an antenna mounted on the printed circuit board, and a matching stub electrically connected to the antenna and configured to provide impedance matching to the antenna,
    wherein at least one of the hole ground pads is used as the matching stub.

2. The portable terminal of claim 1, wherein the antenna apparatus is a Bluetooth antenna apparatus.

3. The portable terminal of claim 1, wherein a non-ground region not used for grounding is formed at an edge of the printed circuit board, and the antenna apparatus is mounted on the non-ground region.

4. The portable terminal of claim 1, wherein the matching stub is formed at a periphery region of at least one of the screw holes as a semicircular band shape.

5. The portable terminal of claim 1, wherein the matching stub is implemented by electrically connecting one of the hole ground pads to the antenna as a non-ground state.

6. A portable terminal, comprising:
    a terminal body;
    a printed circuit board mounted at an inner space of the terminal body, the printed circuit board having a plurality of screw holes configured to allow the printed circuit board to be screw-coupled to the terminal body;
    a plurality of hole ground pads configured to connect a ground of the printed circuit board to a ground layer of the terminal body, each of the plurality of hole ground pads being formed at a periphery of a corresponding one of the screw holes; and
    an antenna apparatus including an antenna mounted on the printed circuit board, and a matching stub electrically connected to the antenna and configured to provide impedance matching to the antenna,
    wherein at least one of the hole ground pads is separately divided into first and second pads, the first pad being not grounded and connected to the antenna thus to be used as the matching stub, and the second pad being grounded.

7. An antenna apparatus, comprising:
    an antenna mounted on a printed circuit board, the printed circuit board having a plurality of screw holes configured to allow the printed circuit board to be screw-coupled to a terminal body, and a plurality of hole around pads configured to connect a ground of the printed circuit board to a ground layer of the terminal body; and
    a matching stub electrically connected to the antenna and configured to provide impedance matching to the antenna,
    wherein each of the plurality of hole ground pads is formed at a periphery of a corresponding one of the screw holes, and at least one of the hole ground pads is used as the matching stub.

8. The antenna apparatus of claim 7, wherein the antenna is a Bluetooth antenna.

9. The antenna apparatus of claim 7, wherein a non-ground region not used for grounding is formed at an edge of the printed circuit board, and the antenna apparatus is mounted on the non-ground region.

10. The antenna apparatus of claim 7, wherein the matching stub is formed at a periphery region of at least one of the screw holes as a semicircular band shape.

11. The antenna apparatus of claim 7, wherein the matching stub is implemented by electrically connecting one of the hole ground pads to the antenna as a non-ground state.

* * * * *